US005973366A

United States Patent [19]

Tada

[11] Patent Number: 5,973,366

[45] Date of Patent: Oct. 26, 1999

[54] HIGH VOLTAGE INTEGRATED CIRCUIT

[75] Inventor: Gen Tada, Nagano, Japan

[73] Assignee: Fuji Electric Co., Ltd., Japan

[21] Appl. No.: 08/997,903

[22] Filed: Dec. 24, 1997

[30] Foreign Application Priority Data

Dec. 25, 1996 [JP] Japan .................................... 8-345294

[51] Int. Cl.[6] .................................................... H01L 27/01

[52] U.S. Cl. ........................... 257/354; 257/544; 257/547

[58] Field of Search .................................... 257/354, 544, 257/547

[56] References Cited

U.S. PATENT DOCUMENTS 5,051,612 9/1991 Agiman ................................ 307/296.2
5,128,729 7/1992 Alonas et al. .......................... 257/354
5,777,362 7/1998 Pearce .................................... 257/335

*Primary Examiner*—Valencia Martin-Wallace
*Attorney, Agent, or Firm*—Rossi & Associates

[57] ABSTRACT

A high voltage integrated circuit is provided which includes a first conductivity type semiconductor substrate, a first conductivity type isolation region that extends continuously from the first conductivity type semiconductor substrate, a substrate electrode formed on a surface of the first conductivity type isolation region, a second conductivity type island-like region that is formed on the first conductivity type semiconductor substrate, such that the entire periphery of the island-like region is surrounded by the first conductity type isolation region, and a plurality of high voltage MOSFETs that are connected to a common power source and operate independently of each other.

14 Claims, 5 Drawing Sheets

HIGH VOLTAGE INTEGRATED CIRCUIT

FIELD OF THE INVENTION

The present invention relates to a high voltage integrated circuit, such as that for driving a plasma display panel, which incorporates a plurality of high voltage devices in the same chip, and in particular to a method of isolating the devices from each other.

BACKGROUND OF THE INVENTION

An integrated circuit for driving a plasma display panel, which may be abbreviated to IC for driving PDP, consists of a high voltage output circuit portion that operates with a high voltage of 100 V or greater, and a logic circuit portion that operates with a voltage of about 5 V. The high voltage output circuit portion includes active elements such as n channel MOSFET or p channel MOSFET, and passive elements such as resistors. These elements constitute a one-bit output circuit portion, and such an output circuit portion is provided for each bit in a circuit for producing a multiplicity of bits of outputs.

In an integrated circuit having a plurality of high voltage devices that operate with 100 V or higher, a pn junction isolation structure using epitaxial wafer or self isolation structure has been employed for isolating the devices from each other. In the following description, "n" or "p" prefixed to regions or layers means that the regions or layers have electrons or holes, respectively, as majority carriers.

FIG. 3 is a cross sectional view of a known example of the pn junction isolation structure. A part of an n epitaxial layer 42 on a p substrate 41 is isolated from the other parts by a $p^+$ embedded region 43 and a $p^+$ isolation region 44 that has a depth large enough to reach the $p^+$ embedded region 43, so as to provide an island-like n region 45. In this island-like n region 45, p base region 46, n source region 47, $n^+$ embedded region 49, and $n^+$ wall region 48 that has a depth enough to reach the $n^+$ embedded region 49 are formed, as shown in FIG. 3. In addition, a gate electrode layer 51 is formed on a gate insulating film 50 over an exposed surface portion of the p base region 46, and a source electrode 52 is formed in contact with the surfaces of the p base region 46 and n source region 47, while a wall electrode 53 that provides a drain is formed in contact with the surface of the $n^+$ wall region 48, so that an n channel MOSFET is formed.

By applying 0 V to a substrate electrode 55 formed on the p isolation region 44 and applying 100 V to the wall electrode 53, pn junction between the island-like n region 45 and p substrate 41 is reverse-biased, and the island-like n region 45 including the $n^+$ wall region 48 is isolated due to the pn junction. The p isolation region 44 and $n^+$ wall region 48 must be spaced from each other by at least about 20 $\mu$gm. An output is taken out from the source electrode 52 formed on the n source region 47. This structure also includes high voltage field plate 56 and low voltage field plate 57 both of which serve to reduce an electric field on its surface. Although not illustrated in FIG. 3, a gate electrode consisting of a metal layer may be often formed in contact with the gate electrode layer 51.

In the structure as described above, the p base region 46, n epitaxial layer 42 and p substrate 41 constitute a parasitic transistor 58. In the case of the IC for driving PDP, in particular, the potential of the source electrode 52 becomes higher than that of the drain electrode 53 in a certain operating mode, and the parasitic transistor 58 may undesirably conduct in such a case. To solve this problem, a high concentration $n^+$ embedded region 49 is provided for limiting parasitic current 59 of the parasitic transistor 58. Although the p base region 46, n epitaxial layer 42 and p isolation region 44 constitute another parasitic transistor, parasitic current of this parasitic transistor is limited by the $n^+$ wall region 48 having a high impurity concentration.

FIG. 4 is a cross sectional view of a known example of the self isolation structure. A p source region 67 and a p drain region 66 are formed in an n well region 62 that is formed in a surface layer of a p substrate 61. In addition, a gate electrode layer 71 is formed on a gate insulating film 70 over the surface of the n well region 62, and a source electrode 73 is formed in contact with the surface of the p source region 67, while a drain electrode 72 is formed in contact with the surface of the p drain region 66. Thus, a MOSFET is provided. By applying 0 V to a substrate electrode 75 formed on the p substrate 61, and applying 100 V to the source electrode 73 formed on the p source region 67, an output is take out from the drain electrode 72 formed on the p drain region 66. This structure also includes p+substrate contact region 61*a*, $n^+$ well contact region 62*a,* and $p^+$ drain contact region 66*a,* each of which has a high impurity concentration.

Although the self isolation structure of FIG. 4 is available at a low manufacturing cost, the p drain region 66, n well region 62 and p substrate 61 tend to form a parasitic transistor 78, which undesirably produces a relatively large parasitic current 79. The pn junction isolation structure of FIG. 3, on the other hand, is manufactured at a relatively high cost, but is advantageous in reduced parasitic current 59 of the parasitic transistor 58 as described above.

FIG. 5 is a circuit diagram illustrating one example of IC for driving PDP, which is a push-pull circuit that is constructed to produce multiple-bit outputs. In this example, n channel FETs are connected in series between Vdd of 100 V and Vss of 0 V. Since the output varies in a range of 0 to 100 V, this circuit is constituted by high voltage devices having a withstand voltage of 1000 V or higher.

FIG. 6 is a cross sectional view showing a portion of an integrated circuit on the high voltage side thereof, which realizes the circuit of FIG. 5 (with three outputs in this case) using pn junction isolation. Individual semiconductor devices are formed in respective island-like n regions 85*a,* 85*b,* 85*c* that are isolated from each other by pn junction, and adjacent devices are separated from each other by a $p^+$ embedded region 83 and a p isolation region 84. The isolation of the devices is achieved by applying a high voltage of 100 V or greater between the p isolation region 84 and an $n^+$wall region 88, and therefore a spacing of 20 ,m or larger, for example, is needed between these regions 84, 88 in each junction isolation portion, so that the device will not break down even with the high voltage applied thereto. With such a spacing provided for each device, the chip area is undesirably increased. Further, the pitch or interval between the adjacent devices cannot be reduced to such an extent as recently required in integrated circuits for producing multiple-bit outputs.

SUMMARY OF THE INVENTION

It is therefore an object of the present invention to reduce the area of an isolating portion needed for pn junction isolation, by recognizing a required isolating portion to achieve isolation of devices, and to provide a high voltage integrated circuit capable of producing multiple-bit outputs, for example, wherein its devices or elements are arranged at a reduced pitch.

To accomplish the above object, the present invention provides a high voltage integrated circuit comprising a first conductivity type semiconductor substrate, a first conductivity type isolation region that extends continuously from the first conductivity type semiconductor substrate, a substrate electrode formed on a surface of the first conductivity type isolation region, a second conductivity type island-like region that is formed on the first conductivity type semiconductor substrate, such that an entire periphery of the island-like region is surrounded by the first conductivity type isolation region, and a plurality of high voltage MOSFETs that are connected to a common power source, and operate independently of each other.

Where the integrated circuit outputs multiple bits as in an IC for driving a plasma play panel, for example, drains (in the case of n channel type MOSFET) or sources (in the case of p channel type MOSFET) of devices on the side of the power supply, out of all devices that constitute a push-pull circuit, are short-circuited to the power supply by wiring. Accordingly, a junction isolation portion for establishing pn junction isolation need not be provided between adjacent ones of these devices, and the whole devices on the side of the power supply may be formed in a single island-like n type region, and the island-like n type region as a whole may be short-circuited to the power supply.

In one preferred form of the invention, the integrated circuit further includes a high concentration second conductivity type embedded region that is formed in a selected lower portion of the second conductivity type island-like region, a ring-like second conductivity type wall region that extends from a surface of the second conductivity type island-like region to a depth large enough to reach the second conductivity type embedded region, so as to surround each of the plurality of high voltage MOSFETs, and a wall electrode that is formed on a surface of the second conductivity type wall region. In this arrangement, the high concentration second conductivity type embedded region and the ring-like second conductivity type wall region serve to prevent conduction of parasitic transistors.

In the integrated circuit constructed as described just above, the ring-ike second conductivity type wall region that surrounds one of the plurality of high voltage MOSFETs may be connected to the ring-like second conductivity type wall region that surrounds an adjacent one of the plurality of high voltage MOSFETs. In this case, the second conductivity type wall region can be shared by adjacent devices or all devices on the power supply side, which leads to reduction in the chip area.

In another preferred form of the invention, the high voltage integrated circuit further includes a first field plate that is formed on an insulating film over a junction between the second conductivity type island-like region and the first conductivity type isolation region that faces the second conductivity type wall region, the first field plate being wired so that the same potential is applied to the first field plate and the substrate electrode. In this case, the first field plate serves to reduce an electric field on the surface of the boundary between the second conductivity type island-like region and the first conductivity type isolation region that faces the second conductivity type wall region.

In a further preferred form of the invention, the high voltage integrated circuit further includes a second field plate that is formed on an insulating film over a boundary between the second conductivity type island-like region and the second conductivity type wall region that faces the first conductivity type isolation region, the second field plate being wired so that the same potential is applied to the second field plate and the wall electrode. In this case, the second field plate serves to reduce an electric field on the surface of the boundary between the second conductivity type islandlike region and the first conductivity type isolation region that faces the first conductivity type isolation region.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Preferred embodiments of the present invention will be described in detail.

Figure 1:
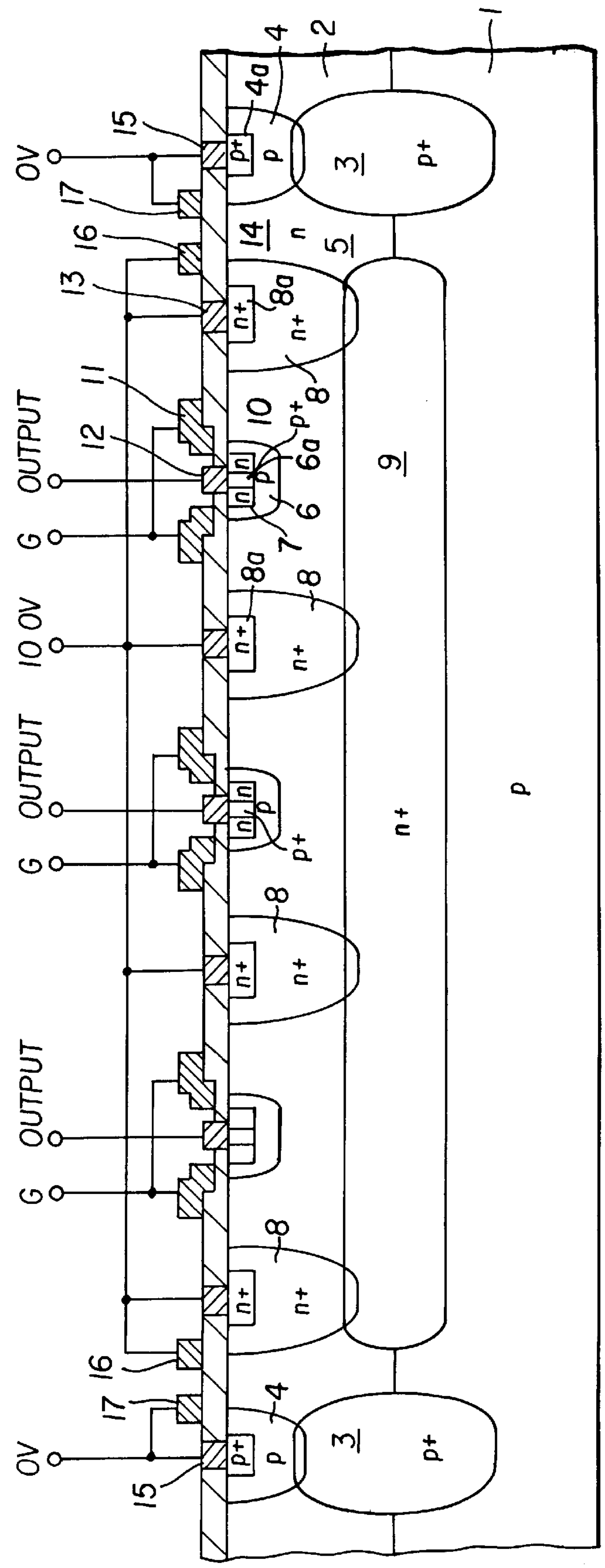
FIG. 1 is a cross sectional view showing a part of a high voltage integrated circuit constructed according to the first embodiment of the present invention.

FIG. 1 is a cross sectional view of an integrated circuit according to the present invention, in which a plurality of high voltage n channel MOSFETs are formed in a single island-like n type region.

A part of an n epitaxial layer 2 formed on a p substrate 1 is isolated from the other parts by a $p^+$ embedded region 3 and a p isolation region 4 having a depth large enough to reach the $p^+$ embedded region 9, so as to provide an island-like n region 5. A plurality of n channel MOSFETs are formed in this island-like n region 5. To provide each n channel MOSFET, n source region 7, p base region 6, $n^+$ embedded region 9, and $n^+$ wall region 8 having a depth large enough to reach the $n^+$ embedded region 9 are formed in the island-like n region 5. Each n channel MOSFET further includes a gate electrode layer 11 that is made of polycrystalline silicon and formed on a gate oxide film 10 over an exposed surface portion of the p base region 6, a source electrode 12 that is formed in contact with the n source region 7 and p base region 6, and a p base contact region **6*a* for reducing contact resistance of the source electrode 12 formed thereon. A substrate electrode 15 is formed in contact with a surface of a high concentration p isolation contact region 4*a* for reducing contact resistance of the substrate electrode 15. A wall electrode 13 that provides a drain electrode is formed in contact with an $n^+$ wall contact region 8*a* for reducing contact resistance of the wall electrode 13. Although not illustrated in FIG. 1, a gate electrode that consists of a metal layer may be often formed in contact with the gate electrode layer 51**.

In FIG. 1, the position (depth from the surface of the structure) at which the $p^+$ embedded region 3 and p isolation region 4 are connected to each other is slightly different from the position (depth from the surface) at which the $n^+$ embedded region 9 and $n^+$ wall region 8 are connected to each other. Both of the $p^+$ embedded region 3 and $n^+$ embedded region 9 are formed by introducing impurities into the p substrate 1 before the growth of the epitaxial layer 2, and subjecting the impurities to epitaxial growth and subsequent heat treatment. Both of the p isolation region 4 and $n^+$ wall region 8 are formed by diffusing impurities introduced from the surface of the epitaxial layer 2. The difference in the above connecting positions is due to differences in the type and amount of impurities introduced, or heat treatment time. For example, boron is used as impurities for forming the $p^+$ embedded region 3 and p isolation region 4, and antimony is used as impurities for forming the $n^+$ embedded region 9, while phosphorous is used as impurities for forming the $n^+$ wall region 8.

By applying 0 V to the substrate electrode 15 and applying 100 V to the wall electrode 13, the pn junction between the island-like region 5 and the p substrate 1 is reverse-biased, and the single island-like n region 6 including the $n^+$ wall region 8 is isolated by the pn junction. A high voltage field plate 16 to which 100 V is to be applied is formed on a portion of an insulating layer 14 over the boundary between the island-like n region 5 and the $n^+$ wall region 8 facing the p isolation region 4, and a low voltage field plate 17 to which 0 V is to be applied is formed on a portion of the insulating layer 14 over the junction between the island-like n region 5 and the p isolation region 4 facing the $n^+$ wall region 8. Each of these field plates 16, 17 serves to reduce an electric field on the surface of the structure, and thus contributes to an increase in the withstand voltage.

The outputs are taken out from the source electrodes 11 formed on the n source regions 7 of the respective MOSFETs. In comparison with the known example of FIG. 6, the p isolation region 84 provided for each device is eliminated, and a plurality of high voltage n channel MOSFETs (three in the embodiment of FIG. 1) are formed on the common $n^+$ embedded region 9 in this embodiment.

Figure 5:
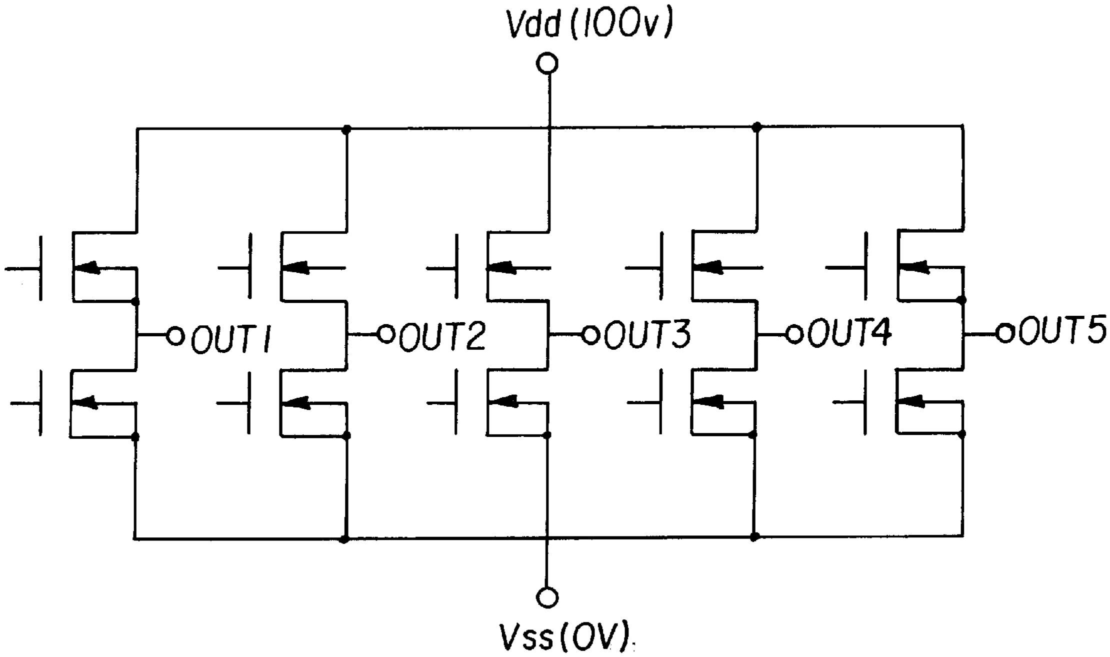
FIG. 5 is a circuit diagram showing a multiple-bit push-pull output circuit.

In the case where the integrated circuit produces multiple-bit outputs as in IC for driving PDP, for example, the drains (in the case of n channel MOSFET) or sources (in the case of p channel MOSFET) of devices on the side of the power supply, out of all devices constituting the push-pull circuit as shown in FIG. 5, are short-circuited to the power supply by wiring. Accordingly, a p type isolation region need not be provided between adjacent ones of the devices on the power supply side, for isolating these devices from each other by pn junction, and the whole devices on the power supply side may be formed in a single island-like n region, as in the present embodiment, so that the islandlike n region as a whole is short-circuited to the power supply.

Since a plurality of devices on the power supply side are formed in the single island-like n region as described above, the pn junction isolation region that was provided for each device in the known circuit can be formed only in a peripheral portion of the island-like n region, resulting in significant reduction in the pitch or interval between the adjacent devices and the chip area. For example, in the present embodiment, the pitch of the devices can be reduced by about 20%, thus making the circuit more highly integrated.

Figure 6:
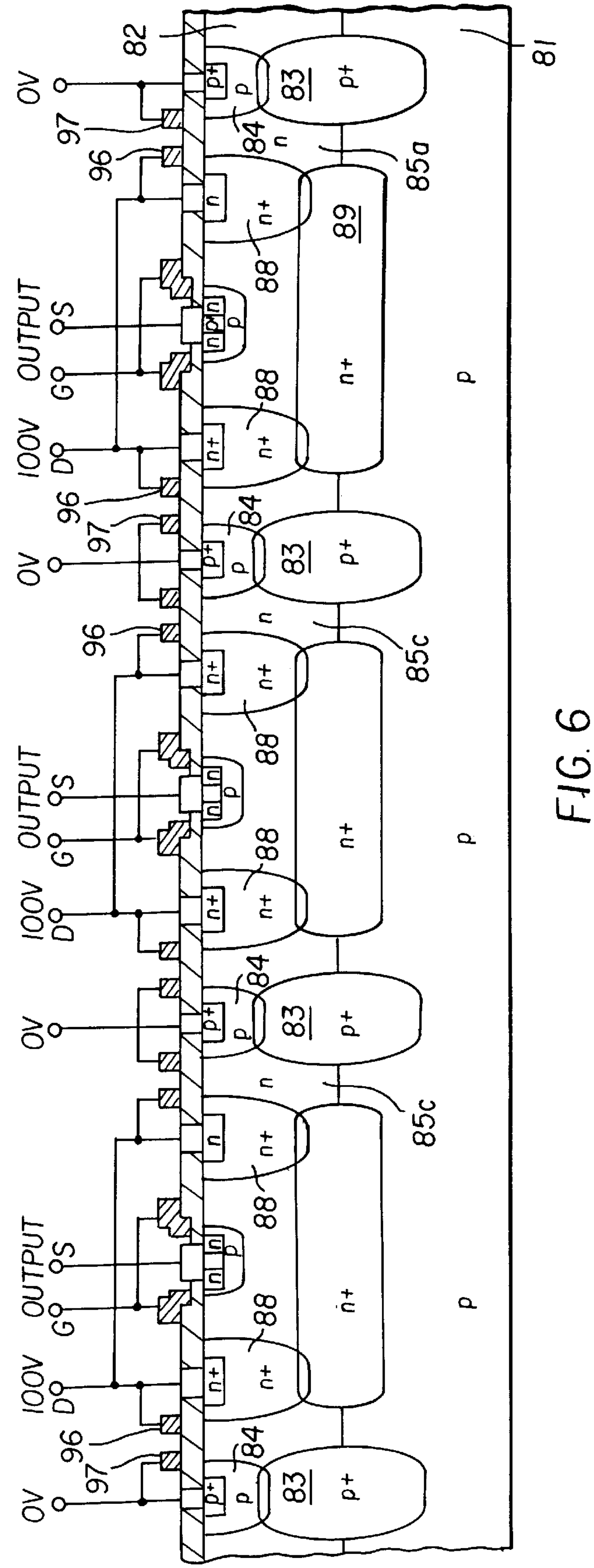
FIG. 6 is a cross sectional view showing a part of a high voltage integrated circuit that realizes the multiple-bit push-pull output circuit of FIG. 5.

In the known example of FIG. 6 in which the p isolation region 84 is formed in each device, the high voltage field plate 96 and low voltage field plate 97 are also disposed so as to surround each of the individual devices, which results in a complicated structure that requires cumbersome wire connection. In the present embodiment, on the other hand, only one high voltage field plate 16 is formed on the outermost periphery of the $n^+$ wall region 8 that faces the p isolation region 4, and only one low voltage field plate 16 is formed on the inner periphery of the p isolation region 4 that faces the $n^+$ wall region 8, thereby providing a simplified structure that permits easy wire connection.

The $n^+$ embedded region 9 is provided for limiting parasitic current of a parasitic transistor that consists of the p base region 6, n epitaxial layer 2 and p substrate 1. Also, parasitic current of a parasitic transistor consisting of the p base region 6, n epitaxial layer 2 and p isolation region 4 is limited by the $n^+$ wall region 8 that is formed between active regions (regions where gate and source are formed) of adjacent devices with a depth large enough to reach the $n^+$ embedded region 9, though the p isolation region 4 is not formed in each device.

As described above, all of the devices on the side of the power supply are formed in a single island-like n type region, so that the pn junction isolation region that was provided for each device in the known circuit is formed only in the outer peripheral portion of the island-like n type region, and the field plates are also formed only in the outer peripheral portion of the same region. Accordingly, the pitch of the devices can be reduced, and the chip area of the integrated circuit can be significantly reduced, so that the resulting circuit may be suitably used as IC for driving a plasma display panel, for example.

Figure 2:
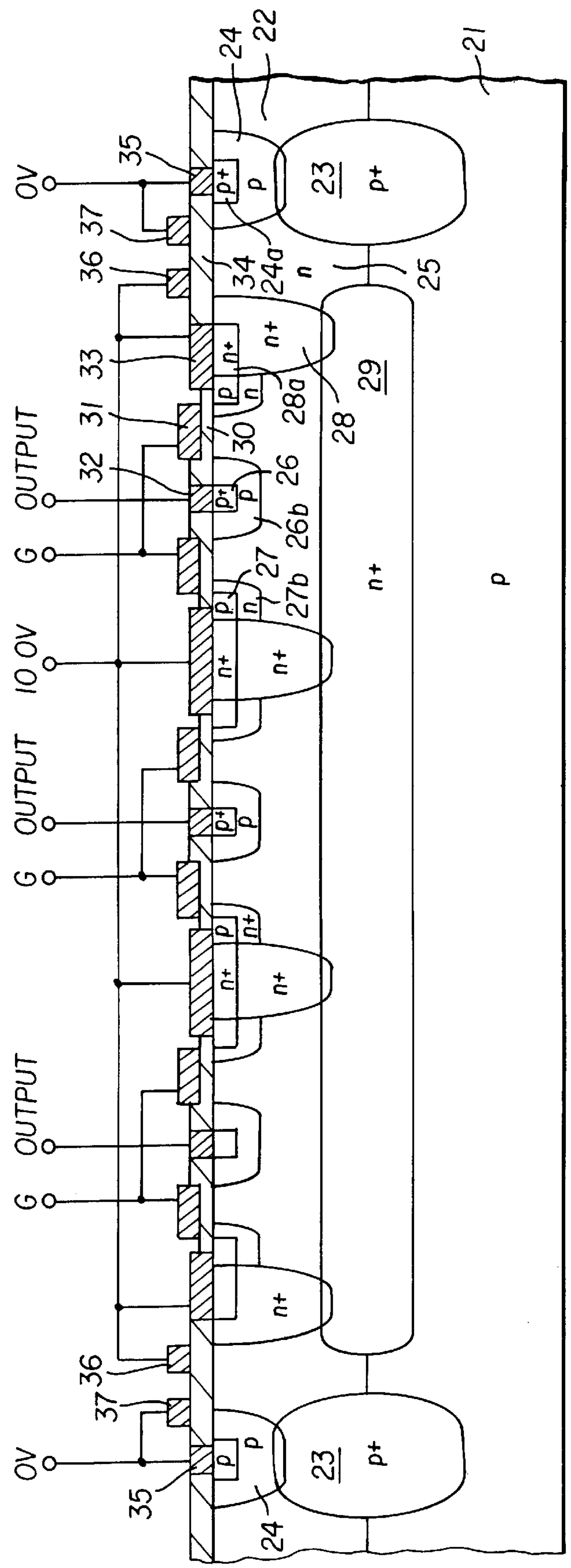
FIG. 2 is a cross sectional view showing a part of a high voltage integrated circuit constructed according to the second embodiment of the present invention.
Figure 3:
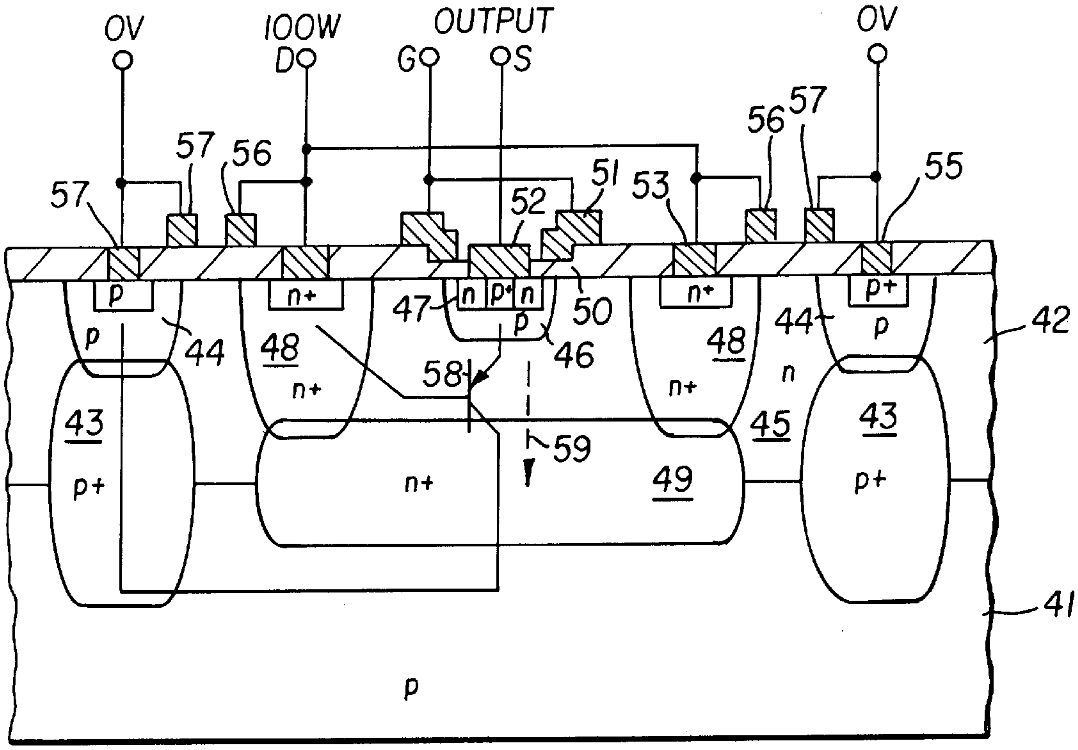
FIG. 3 is a cross sectional view showing a known example of high voltage integrated circuit having a pn junction isolation structure.
Figure 4:
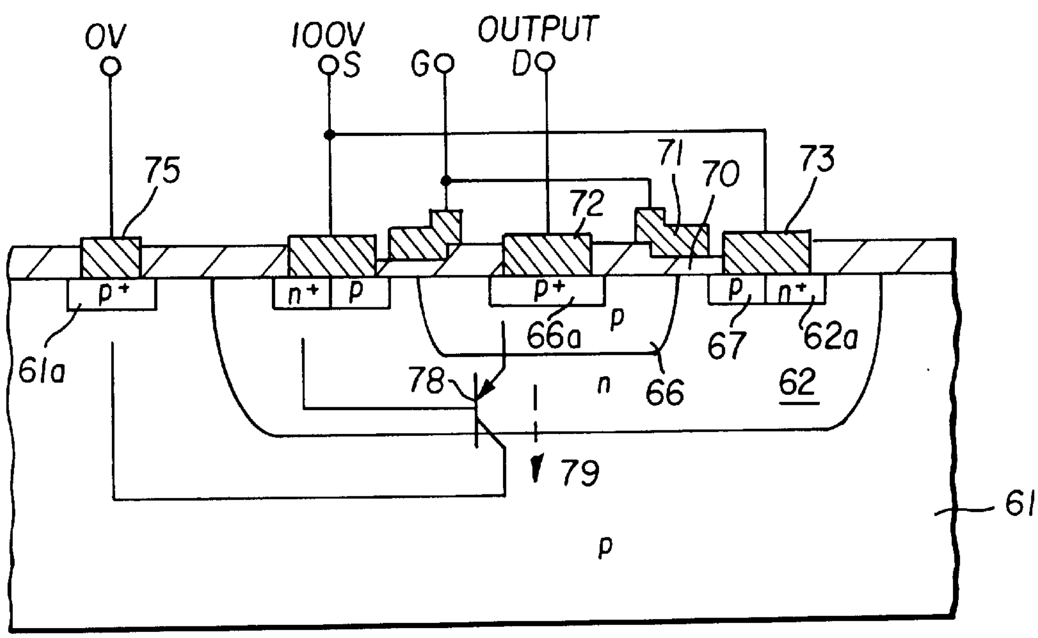
FIG. 4 is a cross sectional view showing another known example of high voltage integrated circuit.

FIG. 2 is a cross sectional view showing a portion of an integrated circuit according to another embodiment of the present invention, in which a plurality of high voltage p channel MOSFETs are formed in a single island-like n type region.

A part of an n epitaxial layer 22 formed on a p substrate 21 is isolated from the other parts by a $p^+$ embedded region 23 and a p isolation region 24 having a depth large enough to reach the $p^+$ embedded region 23, to thus provide an island-like n region 25. An $n^+$ embedded region 29 is formed at the boundary between the p substrate 21 and the n epitaxial layer 22, and an $n^+$ wall region 28 is formed with a depth large enough to reach the $n^+$ embedded region 29. A plurality of p channel MOSFETs are formed in the island-like n type region 25. To provide each of the p channel MOSFETs, p source region 27, n well region **27*b* that surrounds the p source region 27 and has a higher concentration than the n epitaxial layer 22, p drain region 26, and p drain offset region 26*b* that surrounds the p drain region 26 and has a higher concentration than the p drain region 26 are formed inside the $n^+$ wall region 28. Further, a gate electrode layer 31 made of polycrystalline silicon is formed on a gate oxide film 30 over an exposed surface portion of the n epitaxial layer 22 and n well region 27*b* that is located between the p source region 27 and the p drain offset region 26*b*, and a drain electrode 32 is formed in contact with the p drain region. A substrate electrode 35 is formed in contact with an $p^+$ isolation contact region 24*a* formed in the p isolation region 24, and a wall electrode 33 that provides a source electrode is formed in ontact with the p source region 27 and an $n^+$ wall contact region 28*a* formed in the $n^+$ wall region 28. The $p^+$ isolation contact region 24*a* and $n^+$ wall contact region 28*a* serve to reduce contact resistance of the substrate electrode 35 and wall electrode 33**, respectively.

By applying 0 V to the substrate electrode 35 and applying 100 V to the wall electrode 33, the pn junction between the island-like n region 25 and the p substrate 21 is reverse-biased, so that the single island-like n type region 25 including the $n^+$ wall region 28 is isolated by the pn junction. A high voltage field plate 36 to which 100 V is to be applied is formed on an insulating film 34 at the outer boundary between the $n^+$ wall region 28 and the n epitaxial layer 22, and a low voltage filed plate 37 to which 0 V is to be applied is formed on another portion of the insulating film 34 over the junction between the n epitaxial layer 22 and the p isolation region 24 facing the $n^+$ wall region 28. Each of these field plates 36, 37 serves to reduce an electric field on the surface of the structure, and thus contributes to an increase in the withstand voltage. The outputs are taken out from the drain electrodes 32 formed on the $p^+$ drain regions 26.

In the present embodiment, too, the $n^+$ embedded region 29 serves to limit parasitic current of a parasitic transistor that consists of the $p^+$ drain region 26 (and p offset region 26b), n epitaxial layer 22 and p substrate 21, as in the first embodiment. Also, the $n^+$ wall region 28 having a depth large enough to reach the $n^+$ embedded region 29 serves to limit parasitic current of a parasitic transistor that consists of the $p^+$ drain region 26 (and p buffer region 26*b*), n epitaxial layer 22 and p isolation region 24.

In the above-described integrated circuit having the p channel MOSFETs, the pn junction isolating portion that was provided for each device in the known circuit is formed only in the outer peripheral portion of the island-like n region, and a plurality of devices on the side of the power supply can be formed in the single island-like n type region, as in the first embodiment. Also, the field plates are formed only on the outer peripheral portion of the island-like n type region. Thus, the pitch of the devices can be reduced, and the chip area of the integrated circuit can be significantly reduced.

It is to be understood that the present invention may also be applied to integrated circuits wherein the conductivity types of various regions and layers are reversed with respect to those of the illustrated embodiments.

As described above, according to the present invention, a plurality of high voltage MOSFETs that are connected to a common power supply and operate independently of each other are formed in a single island-like second conductivity type region that is isolated by pn junction. Thus, the junction isolating portion that was provided for each device in the known circuit is formed only in the outer peripheral portion of the island-like region, and therefore the chip area is significantly reduced. Further, the pitch of the devices, or interval between adjacent devices, is reduced, thus making it possible to install an increased number of elements or devices on a single chip, as required in recent integrated circuits.

In particular, the high concentration second conductivity type embedded portion and ring-like second conductivity type wall region provided in the integrated circuit of the invention serve to prevent conduction of parasitic transistors.

Further, the high voltage and low voltage field plates may be formed only on the outermost portion of the single island-like region, thus reducing the areas required for these field plates, and making it easy to wire the field plates and manufacture the whole circuit.

What is claimed is:

1. A high voltage integrated circuit comprising:

a first conductivity type semiconductor substrate;

a first conductivity type isolation region that extends continuously from said first conductivity type semiconductor substrate;

a substrate electrode formed on a surface of said first conductivity type isolation region;

a second conductivity type island-like region that is formed on said first conductivity type semiconductor substrate, such that an entire periphery of the island-like region is surrounded by said first conductivity type isolation region; and a plurality of high voltage MOSFETs that are connected to a common power supply and operate independently of each other, wherein the high voltage MOSFETs are formed in the second conductivitv type island-like region.

2. A high voltage integrated circuit as defined in claim 1, further comprising:

a high concentration second conductivity type embedded region that is formed in a selected lower portion of said second conductivity type island-like region; and a plurality of second conductivity type wall regions that extend from a surface of said second conductivity type island-like region to a depth large enough to reach said second conductivity type embedded region, wherein each of said plurality of high voltage MOSFETs is surrounded a corresponding one of said plurality of second conductivity type wall regions; and a wall electrode that is formed on a surface of each of said second conductivity type wall regions.

3. A high voltage integrated circuit as defined in claim 2, wherein each of said ring-like second conductivity type wall regions is connected to an adjacent one of the ring-like second conductivity type wall regions.

4. A high voltage integrated circuit as defined in claim 1, further comprising a first field plate that is formed on an insulating film over a junction between said second conductivity type island-like region and said first conductivity type isolation region, wherein said first field plate is wired so that the same potential is applied to the first field plate and said substrate electrode.

5. A high voltage integrated circuit as defined in claim 2, firther comprising a first field plate that is formed on an insulating film over a junction between said second conductivity type island-like region and said first conductivity type isolation region that faces said second conductivity type wall region, said first field plate being wired so that the same potential is applied to the first field plate and said substrate electrode.

6. A high voltage integrated circuit as defined in claim 5, further comprising a second field plate that is formed on an insulating film over a boundary between said second conductivity type island-like region and said second conductivity type wall region that faces said first conductivity type isolation region, said second field plate being wired so that the same potential is applied to the second field plate and said wall electrode.

7. A high voltage integrated circuit as defined in claim 3, further comprising a first field plate that is formed on an insulating film over a junction between said second conductivity type island-like region and said first conductivity type isolation region that faces said second conductivity type wall region, said first field plate being wired so that the same potential is applied to the first field plate and said substrate electrode.

8. A high voltage integrated circuit as defined in claim 7, further comprising a second field plate that is formed on an insulating film over a boundary between said second conductivity type island-like region and said second conductivity type wall region that faces said first conductivity type isolation region, said second field plate being wired so that the same potential is applied to the second field plate and said wall electrode.

9. A high voltage integrated circuit comprising:

a p substrate;

an n epitaxial layer formed on said p substrate;

a p isolation region that extends continuously from said p substrate;

a substrate electrode formed on a surface of said p isolation region;

an island-like n region that is formed by isolating a portion of said n epitaxial layer by said p isolation region;

a high concentration $n^+$ embedded region that is formed along a part of a boundary between said p substrate and said n epitaxial layer; and a plurality of MOSFETs each of which comprises a ring-like high concentration $n^+$ wall region that extends from a surface of said island-like n region to a depth large enough to reach said $n^+$ embedded region, a p base region that is formed in a selected portion of a surface layer of said island-like n region surrounded by said ring-like $n^+$ wall region, an n source region formed in a surface layer of said p base region, a gate electrode layer comprising polycrystalline silicon, which is formed on an insulating film over an exposed surface portion of said p base region, a source electrode formed in contact with both of said n source region and said p base region, and a drain electrode formed in contact with a surface of said $n^+$ wall region;

wherein said plurality of MOSFETs are formed in said island-like n region.

10. A high voltage integrated circuit as defined in claim 9, furter comprising a first field plate that is formed on an insulating film over a junction between said island-like n region and said p isolation region that faces said $n^+$ wall region, said field plate being wired so that the same potential is applied to the first field plate and said substrate electrode.

11. A high voltage integrated circuit as defined in claim 9, further comprising a second field plate that is formed on an insulating film over a boundary between said island-like n region and said $n^+$ wall region that faces said p isolation region, said field plate being wired so that the same potential is applied to the second field plate and said drain electrode.

12. A high voltage integrated circuit comprising:

a p substrate;

an n epitaxial layer formed on said p substrate;

a p isolation region that extends continuously from said p substrate;

a substrate electrode formed on a surface of said p isolation region;

an island-like n region that is formed by isolating a portion of said n epitaxial layer by said p isolation region;

a high concentration $n^+$ embedded region that is formed along a part of a boundary between said p substrate and said n epitaxial layer; and a plurality of MOSFETs each of which comprises a ring-like high concentration $n^+$ wall region that extends from a surface of said island-like n region to a depth large enough to reach said $n^+$ embedded region, a p offset region that is formed in a selected portion of a surface layer of said island-like n region surrounded by said ring-like $n^+$ wall region, a p drain region formed in a surface layer of said p offset region, an n well region formed in another selected portion of the surface layer of said island-like n region, a p source region formed in a surface layer of said n well region, a gate electrode layer comprising polycrystalline silicon, which is formed on an insulating film over an exposed surface portion of said n well region and said n epitaxial layer that is interposed between said p offset region and said p source region, a source electrode formed in contact with both of said p source region and said $n^+$ wall region, and a drain electrode formed in contact with a surface of said p drain region;

wherein said plurality of MOSFETs are formed in said island-like n region.

13. A high voltage integrated circuit as defined in claim 12, futher comprising a first field plate that is formed on an insulating film over a junction between said island-like n region and said p isolation region that faces said $n^+$ wall region, said field plate being wired so that the same potential is applied to the first field plate and said substrate electrode.

14. A high voltage integrated circuit as defined in claim 13, further comprising a second field plate that is formed on an insulating film over a boundary between said island-like n region and said $n^+$ wall region that faces said p isolation region, said field plate being wired so that the same potential is applied to the second field plate and said source electrode.

* * * * *